United States Patent [19]

Sauerwald et al.

[11] Patent Number: 4,879,717
[45] Date of Patent: Nov. 7, 1989

[54] TESTABLE CARRIERS FOR INTEGRATED CIRCUITS

[75] Inventors: Wilhelm A. Sauerwald, Eindhoven; Johannes DeWilde, Hilversum; Karel J. E. Van Eerdewijk, Best; Franciscus P. M. Beenker; Marinus T. M. Segers, both of Eindhoven, all of Netherlands

[73] Assignee: U.S. Philips Corp., New York, N.Y.

[21] Appl. No.: 239,714

[22] Filed: Sep. 2, 1988

Related U.S. Application Data

[62] Division of Ser. No. 902,910, Sep. 2, 1986.

[30] Foreign Application Priority Data

Sep. 11, 1985 [NL] Netherlands .......................... 8502476

[51] Int. Cl.4 ............................................... G06F 11/00
[52] U.S. Cl. .................................... 371/22.3; 371/25.1
[58] Field of Search ......................... 371/25, 15, 26, 29

[56] References Cited

U.S. PATENT DOCUMENTS

4,701,922 10/1987 Kuboki ................................. 371/25
4,710,930 12/1987 Hatayama ............................. 371/25
4,710,931 12/1987 Bellay .................................. 371/25
4,710,933 12/1987 Powell ................................. 371/25
4,728,883 3/1988 Green .................................. 371/25

Primary Examiner—Michael R. Fleming
Attorney, Agent, or Firm—Steven R. Biren

[57] ABSTRACT

A method of testing an interconnection function between two integrated circuits which are mounted on a carrier and which are interconnected by data connections, for example a printed wiring board, is disclosed. The integrated circuits are also connected to a serial bus via which test patterns and result patterns can be communicated between a test device which can be connected thereto and the respective integrated circuits. The bus of a preferred embodiment is formed by a so-called I2C bus. In a further elaboration, this set-up can also be used for testing the internal logic circuitry of the integrated circuits. For the testing of the interconnection function, input/output cells with a parallel connection for performing the normal execution function in a transparent mode are provided. They also include series connections for communication test/result patterns by way of a shift register.

8 Claims, 5 Drawing Sheets

TESTABLE CARRIERS FOR INTEGRATED CIRCUITS

This is a division of application Ser. No. 902,910, filed Sept. 2, 1986.

BACKGROUND OF THE INVENTION

The invention relates to a method of testing integrated circuits which are mounted on a carrier, a test pattern being serially applied for temporary storage to an integrated circuit, set to an input stage, by way of a first connection thereof, the integrated circuit subsequently being set to an execution state in order to form a result pattern from said test pattern, the result pattern being serially output by the integrated circuit, set to an output state, by way of a second connection thereof in order to form a characterization of correct/incorrect operation of the integrated circuit by checking the information content thereof. One example of such a carrier is provided with printed wiring (printed circuit board), but the invention is not restricted to such interconnection technology. As integrated circuits become more complex, the need for a reliable test method increases, because the rejection of a product during an early production phase is usually substantially less expensive than rejection during a later production phase. An integrated circuit can be thoroughly tested prior to mounting on such a carrier, so that the risk of a non-detected fault occurring in such an integrated circuit is negligibly small. However, it has been found that the testing of the carrier together with the mounted circuits in a structural test is useful, because an integrated circuit may be damaged during mounting and because an interconnection function may be faulty. A structural test checks whether given connections are present and operational, for example, whether two connections do not form a short-circuit. Functional aspects are not completely tested. The latter aspects may concern, for example, the high-frequency behavior of a circuit, fan-in/fan-out of parts and the like.

It is known to test combined, integrated circuits according to the "scan test" principle, for example as described in U.S. Pat. No. 3,761,695, in which the various integrated circuits are successively dealt with. According to the scan test principle, a number of bistable elements present in the integrated circuit are connected in a shift register in the input state and the output state, so that the test and result patterns can be serially input into and output from the shift register, respectively. In the execution state, these bistable elements are used as if the circuit were in normal operation. The principle described in the cited Patent can be extended to the "serpentine" concept described hereinafter with reference to FIG. 1. The drawbacks which limit the usability of this concept are also described. VLSI circuits, and machine-aided testing techniques therefor, are described in U.S. Pat. No. 4,656,592.

SUMMARY OF THE INVENTION

It is an object of the invention to extend the usability of the scan test principle to the interconnection function between the integrated circuits, without necessitating the use of large numbers of additional connection pins, while enabling a simple organization in which only the necessary tests need be performed because a simple selection organization is feasible.

The object is achieved in accordance with the invention in that, when the carrier is provided with a plurality of digital integrated circuits which are interconnected by way of data lines and each of which is provided with such first and second connections, the assembly of integrated circuits is tested in that said first and second connections are connected in parallel to a data line of a serial bus in order to communicate said test and result patterns thereon, said serial bus also including a clock line for synchronization signals for synchronizing data transports via the data line, said serial bus including a third connection for communicating said test-/result patterns and associated synchronization signals to an environment, at least two of the integrated circuits being set to a test state by selection information during a test, after which a test pattern is applied to at least one of these integrated circuits in order to test an interconnection function between said at least two integrated circuits, after the temporary activation of the relevant integrated circuit in the execution state of at least one other one of said at least two integrated circuits, a resulting pattern generated on the basis of the latter test pattern being the output for testing. It has been found that serial buses are suitable communication vehicles. The test bus may now be separate from other data lines; this enhances the flexibility of design. A serial bus is to be understood to mean a bus in which the width of the data path is substantially smaller than the basic data unit. For a word length of, for example, 16 bits to be communicated, the bus width amounts to at the most eight bits. Usually a restriction will be made to four or less bits, preferably even to a data width of one or two bits. The advantage of a small width will be evident: the number of connections required will be smaller. Furthermore, the number of errors introduced by imperfections of the bus structure will be smaller in the case of a small data path width. The solution in accordance with the invention is attractive notably in that many integrated circuits include a serial control bus connection. Such a control bus usually includes only one data line. An attractive realization is described in European Patent Specification 51 332 and the corresponding U.S. patent application Ser. Nos. 310 686 (now abandoned) and 316 693, incorporated herein by way of reference. This bus concept has become commonly known as an I²C bus. However, the invention is not restricted to the use of this specific bus concept. For example, two synchronization lines may be provided.

Integrated circuits can be set to the test state by means of a control signal on an appropriate test control connection. Many integrated circuits already include such a connection. The test state is to be understood to mean the input state as well as the output state. The execution state is the "non-test" state. All integrated circuits on the carrier can be set to the test state together. The test pattern is then applied to specific integrated circuits by addressing the relevant circuit. For input and output different circuits can then be addressed. It will be apparent that it is alternatively possible to set only a selection of the integrated circuits simultaneously to the test state; this is advantageous, for example when there are several circuits having the same address which is realized by wiring (in hardware). On the other hand, the addresses can also be set according to a program, for example during an initiation phase.

The interconnection function between two (or more) integrated circuits is to be understood to mean the operational behavior, and hence implicity the correct/incorrect structure of the following elements or a part thereof:

a. the conductor pattern provided on the carrier: test for interruption and/or short-circuit;
b. the connection between the conductors and the connection pins of the integrated module;
c. the connection between these connection pins and the bond pads provided on the substrate of the integrated circuit, for example by way of bonding wire;
d. any buffer elements present between the bond pad and the input/output for the relevant bit of the test/result pattern;
e. any further elements possibly arranged between the integrated circuits thus connected, at least in as far as their digital operation is concerned. These elements may be passive elements, for example a terminating resistor which couples an interconnection to ground. This may also be an integrated circuit which cannot be tested per se, for example, a conventional TTL module such as a latch circuit or an inverter.

By applying respective test patterns to at least two integrated circuits, the interaction between these test patterns can be determined as a test of a relevant interconnection function. Analogously, the correlation between result patterns from respective integrated circuits can provide information as regards an interconnection function.

Preferably, for the testing of an internal function of a single integrated circuit, first a selection pattern is supplied via the bus in order to set the relevant integrated circuit selectively to a test state, after which a test pattern relating to the relevant integrated circuit is applied and also a control signal for activating the testing of said internal function, a result pattern relating to the test executed again being communicated via the bus. Using the elements added for the testing of the interconnection function, a test as regards an internal function of an integrated circuit can thus also be simply initiated. An interesting example of such an internal test is described in U.S. Pat. No. 4,435,806. Using a single test pattern, a thorough internal test of the integrated circuit can thus be performed. Another possibility is that the test word is not applied via the bus but is formed in the integrated circuit itself, either directly or by digital expansion of external information received. The result word can also be evaluated in the integrated circuit itself or be prepared by digital compacting for application to the external test device. As a result of these procedures, less information need be communicated via the serial bus. On the other hand, the latter approach is slightly less flexible and necessitates the provision of additional facilities in the integrated circuit.

The invention also relates to a carrier which is provided with such integrated circuits and which is suitable as an object for performing the method. The latter circuits are preferably provided with suitably constructed connection cells which can be serially filled from the serial bus or can serially transfer their data content thereto, and which can be connected to an interconnection network for testing an interconnection function. For interconnections for which the relevant integrated circuit need act exclusively as a data source, only output buffer stages having the function serially-in/parallel-out need be provided for the test. For interconnections for which the relevant integrated circuit need act only as a data destination, only input buffer stages having the function parallel-in/serially-out need be provided for the test. The relevant interconnection also operates during normal use of the integrated circuit, so that there is also provided a parallel connection to the interior of the integrated circuit.

When bidirectional connections of an integrated circuit to the interconnection network must be tested, the relevant connection buffer stages include a series mode input as well as a series mode output on the relevant connection pins as well as to the interior of the integrated circuit. The invention also relates to integrated circuits of this kind. The invention also relates to a device for testing said carriers by means of the method.

BRIEF DESCRIPTION OF THE DRAWING

The invention will be described in detail hereinafter with reference to several Figures. First a realization of the "serpentine" concept and the problems which may be encountered will be described. Subsequently, the I²C bus will be described in brief. Subsequently, the method, the carrier, the integrated circuit and the test device in accordance with the invention will be described.

DESCRIPTION OF THE PREFERRED EMBODIMENTS

Figure 1:
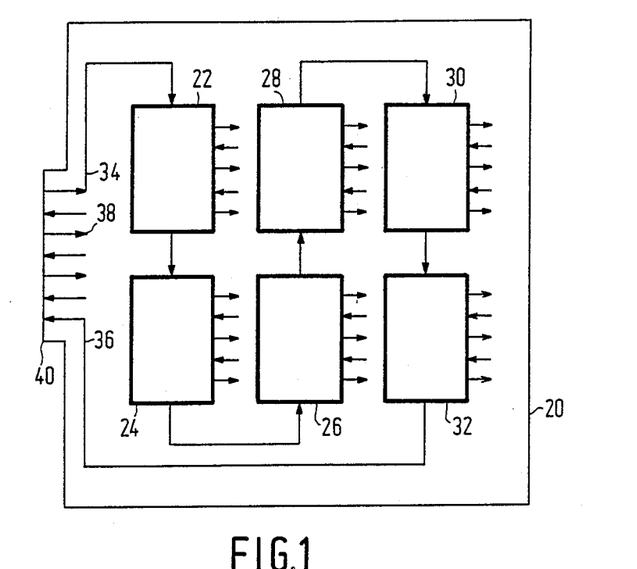
FIG. 1 shows a diagram illustrating the execution of the "serpentine" concept.

FIG. 1 shows a diagram of the "serpentine" concept realized for a carrier 20 provided with integrated circuits 22 . . . 32. The serpentine concept implies that integrated circuits are connected in a chain in that an input line 34 for test patterns is connected to the circuit 22. The latter circuit has an output line for result patterns which also acts as an input line for test patterns for the integrated circuit 24. An output line of the latter circuit acts as an input line for the circuit 26. An output line of the latter circuit acts as an input line for the circuit 28. An output line of the latter circuit acts as an input line for the circuit 30. An output line of the latter circuit acts as an input line for the circuit 32. An output line of the latter circuit is connected to the output line 36 for result patterns for the carrier 20. The integrated circuits include further connections (denoted by arrows) which act as interconnections between the various integrated circuits and between these integrated circuits and the environment. The specific interconnection patterns are determined by the function of the integrated circuit carrier and, because these patterns are irrelevant in this respect, they will not be described in detail. The circuit also includes a connection 40 to the environment which is constructed, for example as a multipole connector. For the sake of simplicity, this connector will not be described. The test patterns can be serially input and the result patterns can be serially output after the part of the integrated circuit to be tested has been temporarily set to an execution state. The integrated circuits can thus be tested; the same is applicable to respective interconnection functions. The number of additional connection pins per integrated circuit is limited, that is to say a serial input, a serial output, possibly a clock input for receiving shift pulses, and a control input. The latter input is fed, for example by the connection 38, so that a bivalent signal enables setting to the execution state and the input/output state, respectively. Due to the series connection of the integrated circuit, the test/result patterns must usually pass through several integrated circuits before arriving at their destination. When a plurality of test/result patterns are simultaneously used, they must be correctly spaced along the serpentine connection thus formed in order to ensure correct input and correct evaluation. Consequently, the test procedure is long and requires constant supervision by the test device, so that the latter device cannot use its processing capacity alternately for the presentation of a test pattern and the evaluation of a previously received result pattern. Furthermore, all integrated circuits should have three additional connection pins, the fact that there is always a sub-optimum number of connection pins available being a secular problem. Therefore, a better solution will be described hereinafter. It is an additional drawback of the concept shown that the serpentine connection occupies part of the space on the carrier, thus implying a larger carrier or a reduction of the number of integrated circuits which can be accommodated.

It is a further drawback of the described serpentine concept that, when one of the circuits malfunctions, it will often be impossible to test the other integrated circuits when test and/or result patterns are mutilated by the serial transport. Furthermore, all integrated circuits present must be operated in mutual synchronism and must all have the relevant test facility. The usability of this concept is thus substantially reduced.

Figure 2:
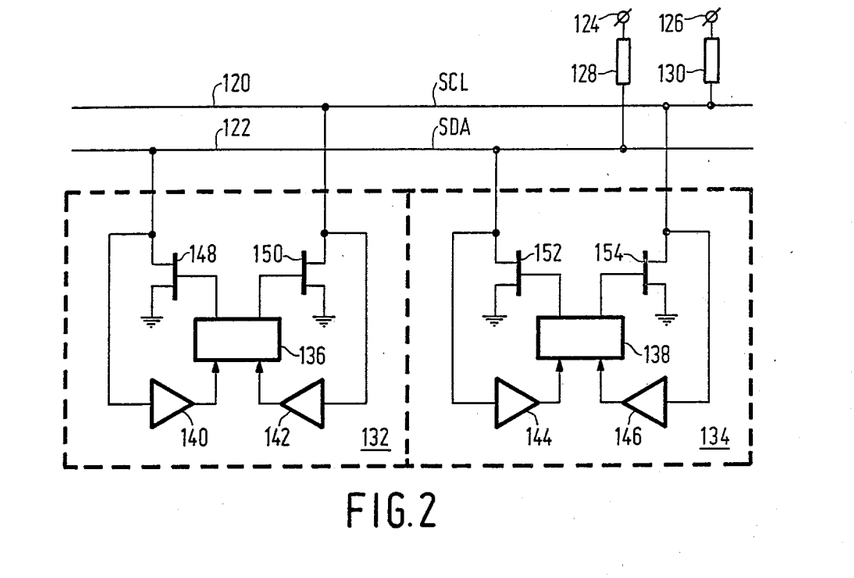
FIG. 2 shows a wiring diagram of the I²C bus.

FIG. 2 shows a wiring diagram of the I²C bus. The Figure shows the connection of two stations to a clock wire 120 (SCL) and a data wire 122 (SDA). The two stations 132, 134 include the signal receivers 140, 142, 144, 146 which are, for example amplifiers having a sufficiently high input impedance. The stations also include the transistors 148, 150, 152, 154 which are constructed, for example as MOS transistors. When one of these transistors is turned on, the relevant line (120, 122) assumes a low potential. Also present are the resistors 128, 130. The terminals 124, 126 are to be connected to a high voltage (VDD). When the transistors 148 and 152 are both turned off, the potential on the line 122 becomes substantially equal to VDD. The values of the resistors 128, 130 are large with respect to the resistances of the transistors in the turned-on state and small with respect to those of the parallel-connected signal receivers connected thereto. When the potential VDD is assumed to be "logic 1", each of the lines 120, 122 performs an "AND"-function for the logic signals received thereon. The stations 132, 134 also include the units 136, 138 which perform the further functions to be implemented in the stations; they notably form a data source and data destination for the two-wire line; the outgoing signals control the conductivity of the transistors 148, 150, 152, 154.

For the present invention an integrated circuit to be tested will act as one of the stations shown in FIG. 2. For implementing the test, the stations need only perform the slave function, so that the test device provides the input/output of the test/result patterns. In that case such a station need not include a clock generator. It may be that the station must act as a master station for other reasons. Usually the I²C bus (or another serial bus) will already have been implemented for other purposes. In that case it will not be necessary to provide additional connections. On the other hand, the I²C bus itself requires only two connection pins.

Figure 3A:
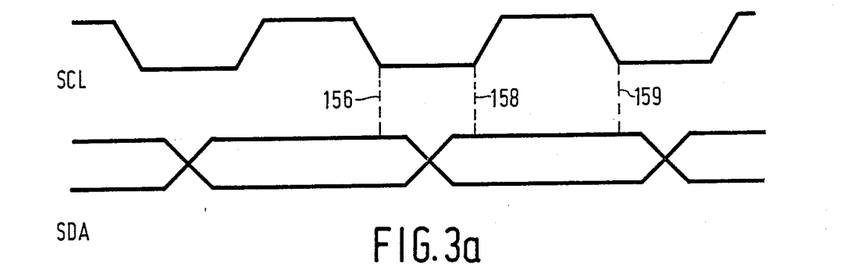
FIGS. 3a, 3b, 3c show associated time diagrams of the data transfer.

FIGS. 3a, 3b, 3c show time diagrams of the data transfer between two stations (one of which may be the test device). The upper line of FIG. 3a (SCL) shows the clock signal. "Low" in this case means "logic 0" and "high" means "logic 1". On the bottom line (SDA) a sequence of databits is shown. The data signal may change between the instants denoted by the lines 156 and 158. Between the instants denoted by the lines 158 and 159 (and hence also during the edges of the clock signal) the data signal must be invariable. For a physical voltage step from 0 volts to +12 volts, the level "logic low" is defined, for example as "physically less than +0.5 volts" and "logic high", for example as "physically at least +10 volts". In the range between +0.5 and 10 volts, the stations need not react uniformly. The slopes thus indicate the "undecided" voltage range. The signals on the line 120 (SCL) are formed by the "master" of the data transport. The non-master stations always produce logic "1"-signals on the line 120, regardless of whether they participate in the data transport or not. The signals on the line 120 (SCL) in FIG. 3a have a periodic nature. The signals on the line 122 (SDA) are formed by a transmitting station. The two parallel lines indicate that the data content may each time be "0" as well as "1". The non-transmitting stations always produce logic "1" signals on the line 122, regardless of whether they participate in the data transport or not. According to the bus concept shown, one master station can transmit data to one or more slave stations, and one slave station can transmit data to one master station.

Figure 3B:
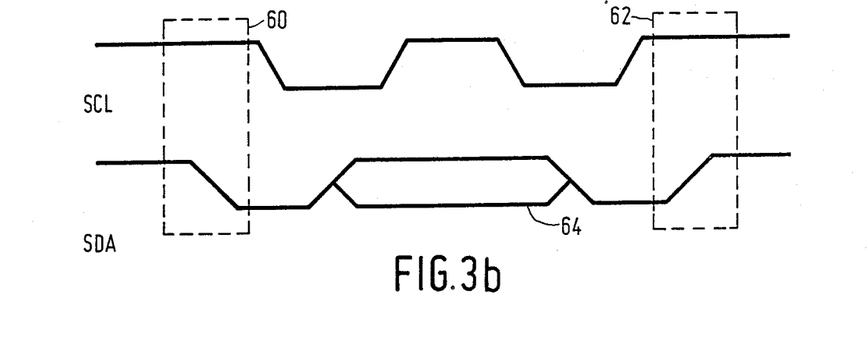

FIG. 3b shows a time diagram concerning the starting and stopping of the data transfer between two stations. Initially, all stations generate high signals on the clock wire and the data wire. The transfer is started in that one of the stations generates a transition from "high" to "low" on the data wire, the signal on the clock wire remaining the same; the relevant station thus presents itself as the new master. This pattern of signals is not admissible during the normal data transfer (FIG. 3a). All other stations thus detect that there is a new master of the bus (block 160). Subsequently, the master produces a transition on the clock line, so that the first data bit can be generated on the data wire; this bit may have the value "0" as well as "1" (164). Thus, the data transfer is always started with the transmitting station as the master station. This station may remain the same throughout the entire communication procedure. On the other hand, the master station may also address another station as the slave station in the course of the procedure and to provide it subsequently with an instruction signal, for example for starting a transmission operation. During transmission by the slave station, the original station remains the "master" station; this implies that the slave station will then transmit a message of predetermined length. For terminating the data transfer, first the transmission by the slave, if any, is terminated: the slave station then outputs high signals on the clock wire and the data wire. Subsequently, the transmission by the master station is terminated by means of a stop signal; first, the clock wire being at a low potential, the potential on the data wire is also made low. Subsequently, first the clock wire potential is made high. Finally (block 162), the potential of the data wire is made high. The latter signal pattern is again not permissible during the normal data transfer. The actual master thus releases the bus line again, so that a next station can present itself as the next "master". The periodic nature of the clock signal (FIG. 3a) is sustained each time only between the start condition (block 160) and the stop condition (block 162). The start and stop conditions per se can be simply detected, subject to the condition that the station either include an interruption mechanism or interrogate the potential of the data wire at least twice per clock pulse period in order to detect the transitions in the blocks 160 and/or 162, or are constantly prepared to detect and honour a signal transition immediately.

Figure 3C:
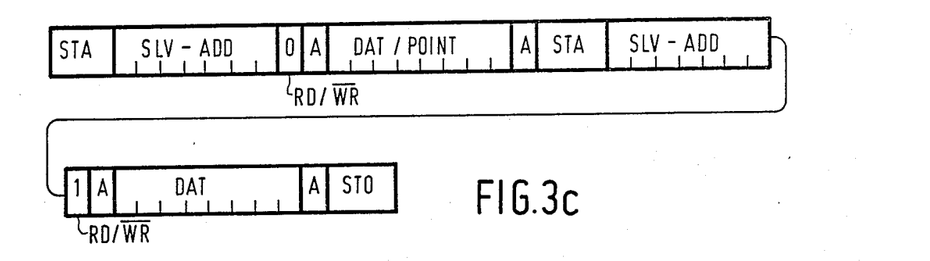

FIG. 3c shows a diagram illustrating a bidirectional data transfer. First the start condition STA is generated by the master station. Subsequently, a seven-bit slave station address is formed. The present example concerns a read access. The eight bit indicates the READ/WRITE operation and has the value zero in the present case. The ninth bit is an acknowledge bit. Pointer information or a data byte can be transferred by means of the next eight bits (DAT/POINT); this may also be, for example a memory address, a control byte or a complete or partial test pattern. The latter data is followed again by an acknowledge bit (A). Subsequent, possibly after a predetermined waiting period, a transition takes place from writing to reading, viewed from the master station. This is realized by the formation of a new start condition: slave address plus a READ/WRITE bit having the value 1. This is followed by an acknowledge bit, one or more (n) data bytes (DAT), each of which is accompanied by its respective acknowledge bit (in the present case n=1), and finally the stop condition (STO). At a higher level the organization may be such that the master (= test device) writes information (test pattern) to two or more different slave stations, and subsequently reads information (= result pattern) from two or more (the same or other) slave stations.

As will be described hereinafter, the I²C bus concept can be advantageously used for testing integrated circuits connected thereto as regards interconnection and/or peripheral functions. For many integrated circuits, such an I²C bus is already suitable for the selective input and output of control data. Furthermore, the relevant connection to an integrated circuit can be used, also prior to the mounting on a carrier, for communicating test/result patterns.

It has been found that the described bus concept and, at least to some extent other serial bus concepts, enable suitable implementation of test principles on mounted integrated circuits. In order to enable testing of the interconnection functions, it will usually not be necessary to know the internal logic construction of the integrated circuits. Furthermore, it will not be necessary either to deal with such interconnections externally in a direct physical manner, neither by a fixed connection thereof to an edge connector of the carrier, nor by a test head which should have another physical shape for any each interconnection configuration. Furthermore, the connection pins specifically provided for testing can be separated from the other data and/or control connection pins. Moreover, no complex multiplex structures will be required for communicating test patterns/result patterns with the various integrated circuits.

Figure 4:
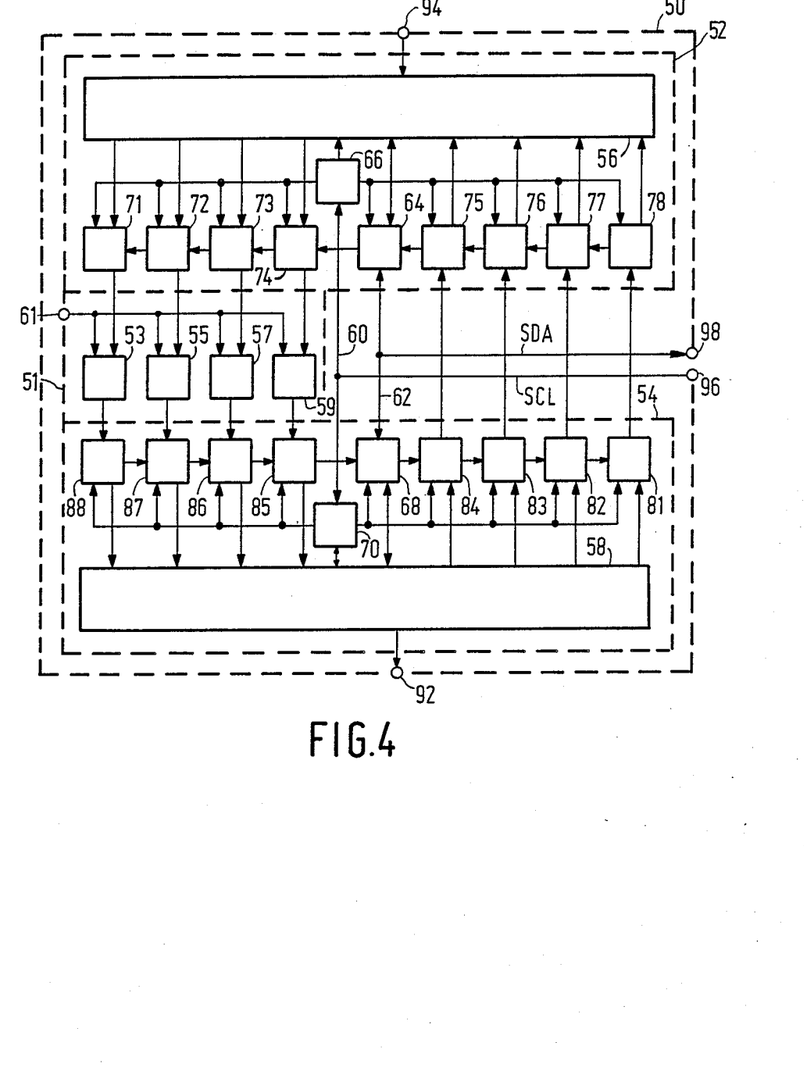
FIG. 4 shows a diagram of a carrier provided with circuits in accordance with the invention.

FIG. 4 shows a carrier provided with integrated circuits in accordance with the invention. The carrier (50) includes connections to the environment, that is to say inputs, only one of which (94) is shown by way of example, and outputs, again only one of which (92) is shown by way of example. These connections are capable of transporting data signals, control signals and other digital signals. Also shown are two connections of an I²C bus, that is to say for data signals (98) and clock signals (96). The data connection is bidirectional; the clock connection need not be bidirectional only if the relevant carrier comprises only integrated circuits which act exclusively as slave stations, so that synchronization is derived from elsewhere. An example of the protocol of the two-wire bus shown has already been described.

In the present simple example the carrier 50 comprises only two integrated circuits 52, 54 between which the interconnection function must be tested. These integrated circuits include blocks 56, 58 whereby the actual logic functions are realized. When the example concerns a microcomputer, the functions of the various circuits are, for example microprocessor, read/write memory, adapters for peripheral equipment and external data buses, etc. In other cases other functions will be realized, but they will not be described herein for the sake of simplicity. In addition to testing, the two-wire I²C bus can also be used for communicating data between the integrated circuits at a speed which is not excessively high, for example control data, coefficient data when a relevant integrated circuit acts as an adjustable filter for filtering data, and the like. The integrated circuits include clock adaptation elements 66, 70. These elements receive clock pulses on the clock line 60, synchronizing the reception of the data on line 62. When constructed accordingly, these elements can also apply clock pulses to the clock line 60 which have been generated by the relevant integrated circuit itself; however, this aspect has been omitted for the sake of simplicity.

Elements 64, 68 form the transmitter/receiver elements for the data on the line 62. These elements receive synchronizing clock pulses from the respective elements 66, 70, possibly derived from clock pulses received via the line 60, reconstruct data bytes for communication with the elements 56, 58, recognize the address of the integrated circuit, and decode mode control signals as received on the two-wire bus. As has already been described, in the reverse direction they are capable of supplying address data and control signals. The integrated circuits also include so-called peripheral cells, that is to say for the circuit 52 the input cells 75, 76, 77, 78 and the output cells 71, 72, 73, 74. For the circuit 54 these are the input cells 85, 86, 87, 88 and the output cells 81, 82, 83, 84. The output cells 81 . . . 84 are connected to the input cells 75 . . . 78, respectively. The output cells 71 . . . 74 are connected to the input cells 85 . . . 88, each time via a respective stage 53 . . . 59 of a quadruple latch circuit 51 which consists of latch stages 53, 55, 57, 59 and which is provided with a control connection 61.

Furthermore, given cells may be bidirectionally interconnected so that, for example, the cell 78 can also act as an output cell and the cell 81 can act as an input cell. The described connections and the latch stages form part of the interconnection function. The interconnection function may be more complex. For example, a single output cell may be connected to a plurality of input cells of a corresponding number of other integrated circuits. Furthermore, morethan one output cell of the same or of several integrated circuits may be connected together to one input cell of another integrated circuit. Such an organization may concern a bus or a multiplex connection. At the logic level the relevant line may implement, for example a wired AND-function. Between the output cells and the input cells there may be connected other elements such as terminating resistors, delay lines, buffer stages, inverters and the like; these elements can be tested in the interconnection function in as far as they do not form an obstacle in the interconnection path.

The integrated circuit 52 of the present embodiment includes four output cells 71 ... 74 which are connected, via latch cells 53, 55, 57, 59, to the input cells 85, 86, 87, 88 of the circuit 54. The overall interconnection function can thus be tested by testing the transfer separately in each of the two directions. In the set-up shown, the input and output cells are included in separate series in each integrated circuit. In given circumstances a chain of output cells may include one or more other cells, for example input cells or internal cells. At these locations a test pattern then contains dummy bits which may be given, for example an arbitrary value by the test pattern source. Similarly, a chain of input cells may include one or more other cells, for example output cells or internal cells. At these locations a result pattern then contains dummy bits which, having an arbitrary value, can be ignored during the evaluation of the result pattern.

The interconnection function between the two integrated circuits of FIG. 4, mounted on the carrier 50, can be tested as follows. Via the serial bus line 62 a fourbit test pattern is applied. In practice such a pattern usually contains many more bits. In the input state the test pattern is serially loaded into the stages 84 ... 81. Loading can be performed by first setting all integrated circuits to a test state by way of a test control signal on a test pin (not shown) of these circuits. Subsequently, the relevant integrated circuit 54 is addressed and set to the input state by a control byte, the procedure being as described for the relevant bus protocol. The control byte also indicates the length of the test pattern. Finally, the actual loading operation is performed, possibly distributed over a number of successive data bytes if the length of the test pattern exceeds the protocol length of a bus word. During the input operation, the length of the test pattern is counted down. When the test pattern is present in the output cells, the integrated circuits are set to the execution state, for example by an appropriate signal on the already described test control connection. The execution state is the "non-test" state. After a given period of time which is measured, for example by counting a number of clock pulses of the internal clock or the clock pulses which continue to appear on the I²C bus, it is assumed that a result pattern is present in the input cells 75, 76, 77, 78 (again only four bits for the sake of simplicity). In given circumstances the duration of the period thus measured need amount to only one clock pulse period. Subsequently, the test state is resumed, the input cells 75 ... 78 are connected as a serial chain and the result pattern is applied, via the element 64 and the data wire 62, to a test device which has been omitted for the sake of simplicity. For example, on the basis of a comparison of the test pattern and the result pattern, the test device supplies a decision correct/incorrect and, if the decision is "incorrect", an error indication in given circumstances.

Subsequently, a next test pattern can be communicated, via the serial bus, to the same or to another integrated circuit until a sufficient number of tests offering a positive result has been completed, or until an error has been detected and/or analyzed. FIG. 4 shows the cells 71 ... 78, 81 ... 88 as being situated at the outer edge (logic) of the integrated circuits. In principle part thereof also be situated logically within the integrated circuits. Evidently, geographically they may be situated at arbitrary locations in the integrated circuits. For the interconnection and/or edge function test to be described hereinafter, only those cells are relevant which are situated logically directly at or substantially at the edge of the circuit.

When a test pattern is applied to a plurality of integrated circuits, a result pattern will be formed in each of the receiving circuits. These result patterns can be separately evaluated. It is alternatively possible to evaluate only one pattern explicitly and to verify for any other patterns which should correspond exactly thereto, only whether they are identical to the first result pattern. Other forms of correlation may also be useful in given cases. When in a given integrated circuit result patterns can be formed on the basis of test patterns formed in several other integrated circuits, the latter integrated circuits will preferably all be provided successively or simultaneously with rest patterns. The interaction between test patterns simultaneously transmitted by different integrated circuits may also be determined on the basis of a result pattern formed on the basis thereof.

The foregoing description concerns the testing of the interconnection function. In addition, the internal operation of a single integrated circuit can be tested in the same way by communication of a test/result pattern via the serial bus when internally communicating cells of the integrated circuit are filled with a test pattern or when a result pattern is derived therefrom. The exclusively internal test can be more easily performed per se on a non-mounted integrated circuit. However, the internal operation of the circuit could have become incorrect after mounting, for example due to an ageing process or because the various integrated circuits together cause a local increase of the temperature due to electric dissipation.

An interconnection pattern can usually be bitwise tested. Via an interconnection path having a width of 4 bits, all bit lines must correctly transport a "1" as well as a "0". Furthermore, no shortcircuits may occur between the various bit lines. For a bit width n, the number of patterns required will not be much larger than 2n. In the case of four bits, for example, there are the following patterns: 0000, 0001, 0010, 0100, 1000, 1111, 1110, 1101, 1011, 0111. For the testing of the internal logic of an integrated circuit, the number of test patterns will usually be much greater. A complete test, including all possible test patterns, contains $2^n$ items, but the execution of such a test usually is unpractical. Another, known test method is the self-test principle described in U.S. Pat. No. 4,435,806. According to this method, the integrated circuit is provided with a generator for a pseudo-edge bit series which acts as a test pattern. By feedback of a primary result pattern, a secondary test pattern is formed. By logic combination of different result patterns in a digital compacting device, a compact result pattern is formed. This logic combination is performed by means of EXCLUSIVE-OR elements, the described "signature analysis" is thus performed. The primary test pattern can also be applied via the serial bus. The ultimate, compact result pattern can be output via the serial bus. This offers the advantage that the bus, is occupied only for a comparatively short period of time.

In the same way, for example using a maximum length shift register, an original primary test pattern supplied can be expanded so as to form a series of test patterns after which the result patterns are compacted again. Compacting and expansion can be implicitly combined in a single device as in the cited Patent Specification.

If, contrary to the foregoing, the internal logic of an integrated circuit does not include the "self-test" facilities, the described generator for the primary test pattern and the compactor can be constructed around this circuit as part of the external logic.

To this end, the integrated circuit (including a facility for "self-test") can be assumed to be subdivided into the following functional modules:
  a. the core which performs the actual functions of the integrated circuit as viewed by a user, and which can be tested according to the self-test principle;
  b. the self-test facilities, notably the pattern expansion device and the pattern compacting device;
  c. the chain of input and output cells which is designed as for the described testing of the interconnection function; and
  d. the control and interface structure for testing.

The requirements imposed on the input/output cells are as follows: in the transparent mode, no significant speed reduction may occur as regards the functional behavior. Furthermore, the cells must include an output mode for a test pattern bit, and an input mode for a result bit.

The self-test facilities can be provided on an additional module in the integrated circuit and be connected to the I²C bus. Even though this does not reduce the load of the I²C bus on the carrier, the period of time during which a test device is occupied is substantially reduced. The latter device can then communicate with several carriers to be tested in a time division multiplex organization.

Figure 5A:
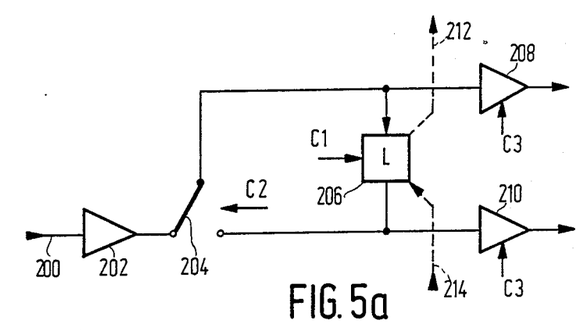
FIGS. 5a, 5b, 5c, 5d show connection cells for use on a carrier as shown in FIG. 4.
Figure 5B:
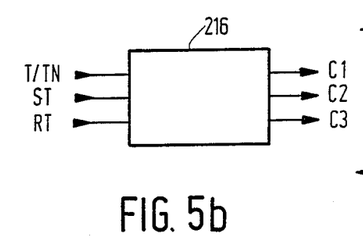

FIGS. 5a . . . 5d show connection cells for use on a carrier as shown in FIG. 4. FIG. 5a shows an example of an input cell. Line 200 is an input pin which can be connected to the environment. Element 202 is a buffer stage, scanning amplifier, etc. which is always active. Element 204 is a switch which is controlled by a signal C2. Element 206 is a latch circuit which is controlled by a signal C1 and which includes two data inputs and two data outputs. The function of the elements 208, 210 corresponds to that of the element 202; however, they can be selectively activated by the signal C3. Only one of these two elements is present. When there are a plurality of input cells, all cells will have the same configuration. FIG. 5b shows an element 216 which is a control decoder. This decoder receives the control signals:

T/TN which selects between the shift function for the input/output states, and respective execution states;

ST which controls the execution state of the internal logic of the integrated circuit;

RT which controls the execution state for the interconnection function.

Element 216 decodes these three control signals into three internal control signals C1, C2, C3.

In the input state/output state the shift function is controlled by the signal C1 as if this signal were a clock signal. In that case the switch 204 occupies the right-hand position and the buffers 208/210 are not activated.

Using the connections 212/214, a shift register can be formed from a plurality of latch circuits.

In the execution state for the internal test of the integrated circuit, the latch circuit 206 is set to "hold" state so that the data stored is continuously available on its output. The switch 204 occupies the right-hand position, so that one of the two elements 208, 210 will receive this data, as desired. These elements are furthermore activated by the signal C3.

In the execution state for the test as regards the interconnection function of the integrated circuit, the latch circuit 206 is set to the transparent state; at the end thereof, it is set to the "hold" state, so that subsequently the data becomes invariable, except for the subsequent activation of the output state. The switch 204 occupies the left-hand position. The elements 208/210 are not activated.

Figure 5C:
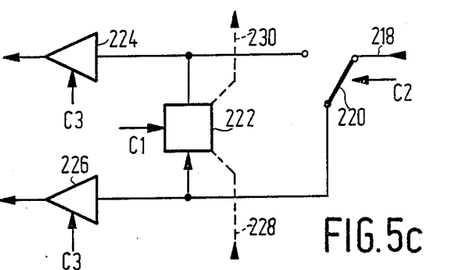

FIG. 5c shows an output cell in the same way as FIG. 5a. Connection 218 is connected to the internal parts of the integrated circuit. Element 220 is a switch. Element 222 is a latch circuit. Elements 224/226 are buffer stages for connection to an interconnection network. Only one of these two elements is present. The connections 228/230 are the interconnection lines to any further latch circuits. The cell is controlled in substantially the same way as that shown in FIG. 5a, be it that the input 218 is not provided with a buffer. The cell acts as a data source for a test concerning the interconnection function, but as a destination device for a test concerning the internal parts of the integrated circuit.

Figure 5D:
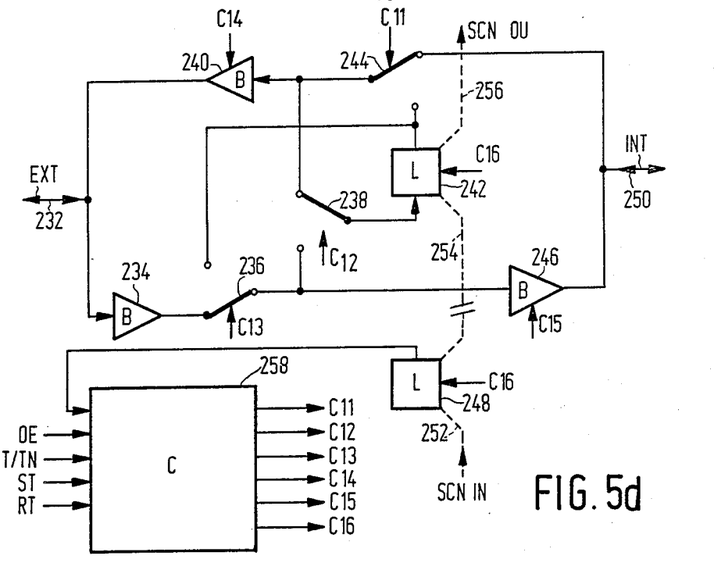

In the same way as the FIGS. 5a, 5c, FIG. 5d shows an input/output cell which can act as a data source as well as a data destination. The connection 232 can be connected to the interconnection network, and the connection 250 can be connected to internal parts of the integrated circuit. Element 234 is a buffer stage which is always active. Elements 240, 246 are buffer stages which are activated by the signals C14 and C15, respectively. Elements 236, 238, 244 are switches which are activated by the signals C13, C12, C11, respectively. Elements 242, 248 are respective latch circuits which are controlled, as shown, by the signal C16 in order to form an input/output shift register. The logic circuitry 258 corresponds to the previously described logic circuitry 216, but also receives the output signal of the latch circuit 248. It also receives an input/output control signal OE.

In the input/output state, the signal C16 controls the formation of the shift register. The buffers 240, 246 are not activated. The switch 236 occupies its upper position. The switch 238 occupies its lower position. The switch 244 occupies an arbitrary position.

In the state in which a test bit is applied to an external interconnection network, the latch circuit 242 is set to the hold state. The buffer 240 is activated. The buffer 246 is not activated. The switch 236 occupies its upper position. The switch 244 occupies its lower position. The switch 238 occupies an arbitrary position.

In the state in which a bit is applied to internal parts of the integrated circuit, the latch circuit 242 is activated in the same manner. The buffer stage 246 is activated. The buffer stage 240 is not activated. The switch 236 occupies its upper position. The switch 244 occupies its lower position. The switch 238 occupies an arbitrary position.

In the state in which a result bit is received from an external interconnection network, the latch circuit 242 is temporarily set to the transparent state. The buffer stages 240, 246 are not activated. The switch 236 occupies its lower position. The switch 238 also occupies its lower position. The switch 244 occupies an arbitrary position.

In the state in which a bit is received from internal parts of the integrated circuit, the latch circuit 242 is controlled in the same way. The buffer stages 240, 246 are not activated. The switch 236 occupies an arbitrary position. The switch 238 occupies its upper position. The switch 244 also occupies its upper position.

For use in a "self-test" system, the described connection cells can be used in a similar manner for communicating test/result bits to the interior of the integrated circuit. When a shift register is formed by a mixture of input and output cells, these cells are together activated for this input/output function in the same manner as described above. Otherwise they are controlled in a series organization.

Figure 6:
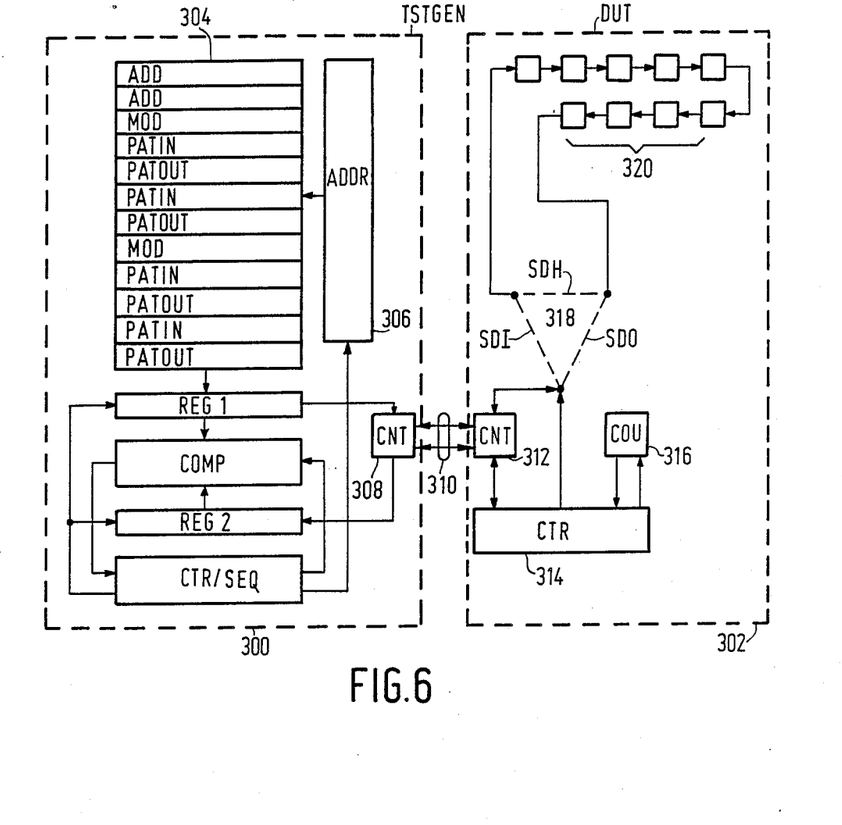
FIG. 6 shows a test device.

FIG. 6 shows a test device 300 whereto a carrier 302 is coupled. In the present example, the test device includes a read-only memory 304 with associated addressing circuit 306. The memory stores addresses (ADD) for the relevant integrated circuits, mode control signals (MOD) which specify the length of the test pattern and which possibly realize other settings, test patterns (PATIN) and associated result patterns (PATOUT). For the sake of simplicity, only a small number of the above signals are indicated. The memory may also contain a control program for data processing in the test device, but this has been omitted for the sake of brevity. Test devices for generating test patterns and for verifying/evaluating result patterns are well known per se. The memory 304 includes an output register REG1. This is connected parallel to the comparator COMP and in series to the interface unit 308. The latter provides bidirectional adaptation to the two-wire serial bus 310. Incoming result patterns are applied from the bus 310 to a second register REG2. The comparator COMP thus compares result patterns in the register REG2 with expected result patterns in the register REG1. The control device CTR/SEQ activates successive memory addresses, activates the registers REG1, 2 in their different modes (parallel-in, parallel-out, serially-in, serially-out) and receives the comparison results for evaluation.

Of the coupled carrier DUT(302) a number of elements of one integrated circuit are shown only diagrammatically. As has already been stated, the integrated circuit is activated by addressing. The other integrated circuits on the carrier are addressed in that they are connected to the serial bus 310 in the same way. The integrated circuit includes an interface unit for the serial bus 312, a control unit CRT(314), a counter 316, a three-position switch 318, and a number of two-state cells which are denoted by blocks. The control unit receives the test pattern length which is loaded into the counter 316. Subsequently, the switch 318 is set to the position SDI in which the paths SDO, SDH are blocked. The test pattern can thus be loaded into the two state cells. As has already been described, these cells may be of a different nature: for example output cells, input cells and internal cells. These cells can be coupled end-around if the switch 318 is set to the position SDH (by a signal from the control unit 314) after the entire test pattern has been received, the paths SDI, SDO then being blocked. Under the control of clock signals (not shown), for example from the control unit 314, the data can continue to circulate in the two-state cells. This is attractive when these cells are of the dynamic logic type which continuously require precharge and sample clock pulses in order to sustain the data. On the other hand, the end-around coupling organization may also include a test pattern expansion device as described in the cited U.S. Pat. No. 4,435,806 and/or a result pattern compacting device which is also known therefrom but also from signature analysis literature.

The test is performed in the already described manner. It may notably be a test as regards the interconnection function. It may also be a test concerning the internal logic of the integrated circuit. At the end of the test, a result pattern will be present in one of the integrated circuits on the carrier. This may be another integrated circuit or the same integrated circuit. For the sake of simplicity it is assumed that the block 320 again represents the two-state cells of the latter integrated circuit. The control unit 314 then sets the three-position switch 318 to the position SDO. The paths denoted by SDI and SDH are then blocked. Via the elements 312, the bus 310,308 the result pattern is stored in the register REG2 for evaluation. If desired, a next test pattern may then be addressed.

What is claimed is:

1. A boundary-scan testable carrier provided with a first and a second integrated circuit mounted thereon and provided with a multibit data path therebetween, said first circuit having a first attachment to a serial bidirectional on-carrier bus such that said first circuit receives a first test control bit string followed by a serial test pattern, and said first circuit having a serial-to-parallel conversion means for feeding said serial test pattern to a multibit output buffer in said first circuit and connected to said data path, said second circuit having a multibit input buffer connected to said data path, a second attachment from said second circuit to said bus for receiving from said bus a second test control bit string and outputting to said bus a serial result pattern as received from said multibit input buffer via a parallel-to-serial conversion means, said result pattern representing a test result of an interconnection function via said data path as controlled by said first and second test control bit strings.

2. A carrier as claimed in claim 1, wherein said serial bus is an I²C bus having one clock line and one data line.

3. A carrier as claimed in claim 1 or 2, wherein at least one buffer stage of said input buffer communicates with any internal part of said second circuit.

4. A carrier as claimed in claim 1 or 2, wherein at least one buffer stage of said output buffer communicates with any internal part of said first circuit.

5. A carrier as claimed in claim 1 or 2, wherein said data path and buffers are bidirectionally operative, said first circuit comprising parallel-to-serial converter means and said second circuit comprising serial-to-parallel converter means, said two converter means being connected to said first and second attachment, respectively.

6. A carrier as claimed in claim 1 or 2, wherein at least one of said buffers has a further buffer stage communicating exclusively with an internal part of its circuit.

7. A carrier as claimed in claim 1 or 2, wherein said first circuit comprises a pattern expansion device between said first attachment and said first series-to-parallel conversion means.

8. A carrier as claimed in claim 1 or 2, wherein said second circuit comprises a pattern compacting device between said parallel-to-series conversion means and said second attachment.

* * * * *